(12) United States Patent
Khan et al.

(10) Patent No.: US 11,572,621 B2
(45) Date of Patent: Feb. 7, 2023

(54) PROTECTIVE DIAMOND COATING SYSTEM AND METHOD

(71) Applicant: AKHAN Semiconductor, Inc., Gurnee, IL (US)

(72) Inventors: Adam Khan, San Francisco, CA (US); Robert Polak, Lindenhurst, IL (US); Kiran Kumar Kovi, Lisle, IL (US)

(73) Assignee: AKHAN SEMICONDUCTOR, INC., Gurnee, IL (US)

(*) Notice: Subject to any disclaimer, the term of this patent is extended or adjusted under 35 U.S.C. 154(b) by 232 days.

(21) Appl. No.: 17/031,762

(22) Filed: Sep. 24, 2020

(65) Prior Publication Data

US 2021/0140037 A1    May 13, 2021

Related U.S. Application Data

(60) Provisional application No. 62/905,099, filed on Sep. 24, 2019.

(51) Int. Cl.
| | |
|---|---|
| *C23C 16/27* | (2006.01) |
| *G02B 5/08* | (2006.01) |
| *C23C 16/02* | (2006.01) |
| *C30B 33/08* | (2006.01) |
| *C23C 16/56* | (2006.01) |
| *C30B 25/18* | (2006.01) |
| *C30B 29/04* | (2006.01) |

(52) U.S. Cl.
CPC ........ *C23C 16/271* (2013.01); *C23C 16/0227* (2013.01); *C23C 16/274* (2013.01); *C23C 16/56* (2013.01); *C30B 25/186* (2013.01); *C30B 29/04* (2013.01); *C30B 33/08* (2013.01); *G02B 5/0808* (2013.01)

(58) Field of Classification Search
CPC ..... C23C 16/27; C23C 16/271; C23C 16/274; C23C 16/56; C23C 16/0227
See application file for complete search history.

(56) References Cited

U.S. PATENT DOCUMENTS

| 5,619,059 A * | 4/1997 | Li ...................... G02B 26/0841 257/431 |
| 2005/0110978 A1* | 5/2005 | Potyrailo ............. G11B 23/281 |

(Continued)

FOREIGN PATENT DOCUMENTS

CN    109576706 A  * 12/2018   ............. C23C 28/00

OTHER PUBLICATIONS

Mallik, A.K., et al., "Effect of Seed Size, Suspension Recycling and Substrate Pre-Treatment on the CVD Growth of Diamond Coatings". Open Journal of Applied Sciences, (2015) 5, 747-763.*

(Continued)

*Primary Examiner* — Bret P Chen
(74) *Attorney, Agent, or Firm* — David R. Stevens; Stevens Law Group

(57) ABSTRACT

Disclosed herein is system and method for protective diamond coatings. The method may include the steps of cleaning and seeding a substrate, depositing a crystalline diamond layer on the substrate, etching the substrate; and attaching the substrate to protected matter. The crystalline diamond layer may reflect at least 28 percent of electromagnetic energy in a beam having a bandwidth of 800 nanometer to 1 micrometer.

8 Claims, 2 Drawing Sheets

(56) References Cited

U.S. PATENT DOCUMENTS

| | | | | |
|---|---|---|---|---|
| 2006/0187608 | A1* | 8/2006 | Stark | C03C 27/08 |
| | | | | 361/202 |
| 2008/0082090 | A1* | 4/2008 | Manstein | A61B 18/203 |
| | | | | 606/9 |
| 2010/0317132 | A1* | 12/2010 | Rogers | H01L 21/6835 |
| | | | | 257/E33.059 |
| 2012/0299175 | A1* | 11/2012 | Tran | B82Y 30/00 |
| | | | | 257/E23.09 |
| 2013/0107352 | A1* | 5/2013 | Santori | B82Y 10/00 |
| | | | | 359/346 |
| 2016/0201221 | A1* | 7/2016 | Misra | C30B 25/20 |
| | | | | 117/85 |
| 2017/0336537 | A1* | 11/2017 | Khan | G02B 1/14 |
| 2018/0068850 | A1* | 3/2018 | Butler | H01L 21/02527 |
| 2018/0127871 | A1* | 5/2018 | Khan | C23C 16/274 |

OTHER PUBLICATIONS

Linnik, Stepan, et al., "Deposition and Patterning of Polycrystalline Diamond Films Using Traditional Photolithography and Reactive Ion Etching". Coatings, 2017, 7, 148, pp. 1-9.*

Bland, Henry A., et al., "Superconducting Diamond on Silicon Nitride for Device Applications". Scientific Reports (2019) 9:2911, pp. 1-9.*

Anupam, K.C., et al., "Effect of seeding density on the growth of diamond films onto silicon substrates by hot-filament chemical vapor deposition from sparse to dense range". Journal of Applied Physics, 130, 225302, (2021), pp. 1-14.*

* cited by examiner

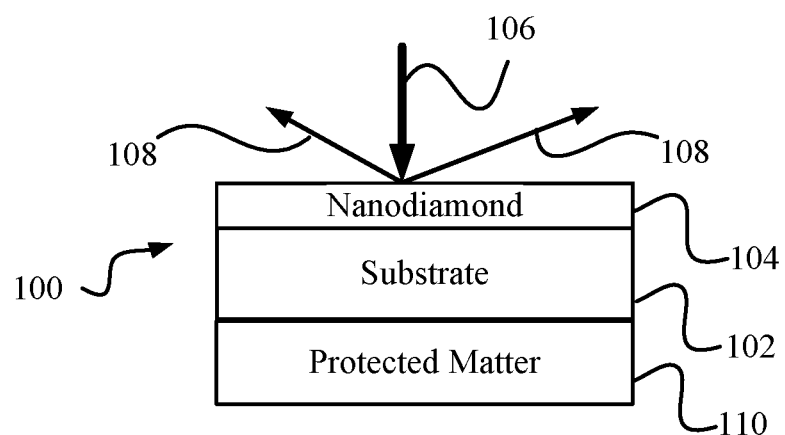
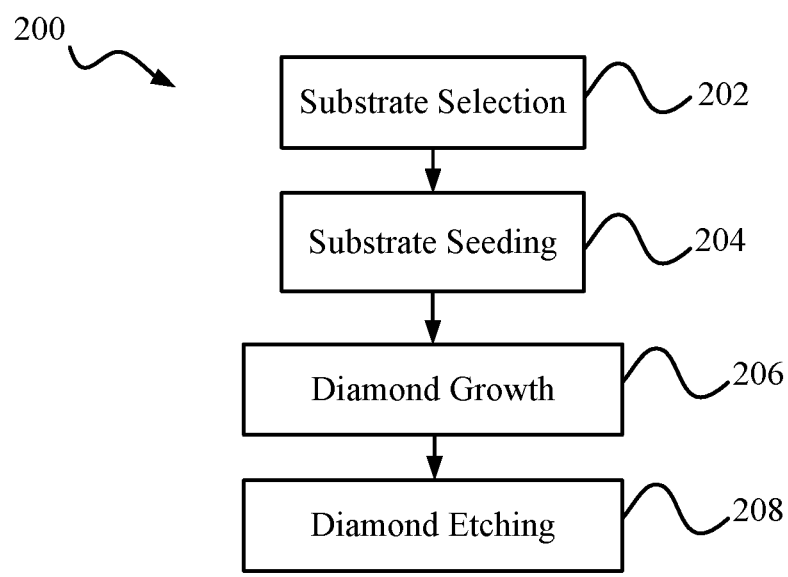

PROTECTIVE DIAMOND COATING SYSTEM AND METHOD

BACKGROUND

Field

This invention is generally related to protective diamond coating systems and methods, and more particularly to a system and method for protecting matter from electromagnetic beams.

Background

Directed energy and electromagnetic weapons are an evolving threat, especially to military vehicles and equipment. There is a desire for countermeasures to improve the ability to withstand attacks or exposure to directed energy and electromagnetic weapons. Protection is needed for opaque surfaces such as cowling material used to cover engines, electronics, personal, and other susceptible systems as well as materials that may be transmissive to visible frequencies, for example windows and canopies, or frequencies that will be radiated or monitored, for example sensor windows or radome materials. Specifically, advanced coating materials are required to both maximize transmissivity and preserve operational integrity under harsh conditions. Prior art systems and methods do not include a practical method and system for protecting matter from electromagnetic beams.

SUMMARY

Disclosed herein is a new and improved system and method for protective diamond coatings. In accordance with one aspect of the invention, a method of fabricating a protective diamond coaling, the method may include the steps of cleaning and seeding a substrate, depositing a crystalline diamond layer on the substrate, etching the substrate; and attaching the substrate to protected matter. The crystalline diamond layer may reflect at least 28 percent of electromagnetic energy in a beam having a bandwidth of 800 nanometer to 1 micrometer.

In another aspect of the invention, the system may include a nanodiamond layer that reflects at least 28 percent of electromagnetic energy in a beam in a bandwidth of 800 nanometer to 1 micrometer, a substrate, and a protected matter.

Other systems, methods, aspects, features, embodiments and advantages of the system and method disclosed herein will be, or will become, apparent to one having ordinary skill in the art upon examination of the following drawings and detailed description. It is intended that all such additional systems, methods, aspects, features, embodiments and advantages be included within this description, and be within the scope of the accompanying claims.

BRIEF DESCRIPTION OF THE DRAWINGS

It is to be understood that the drawings are solely for purpose of illustration. Furthermore, the components in the figures are not necessarily to scale, emphasis instead being placed upon illustrating the principles of the system disclosed herein. In the figures, like reference numerals designate corresponding parts throughout the different views.

FIG. 1 is an exemplary protective diamond coating.

FIG. 2 is a block diagram of an embodiment of a method for fabricating a protective diamond coating, such as the protective diamond coating of FIG. 1.

DETAILED DESCRIPTION

Figure 3:
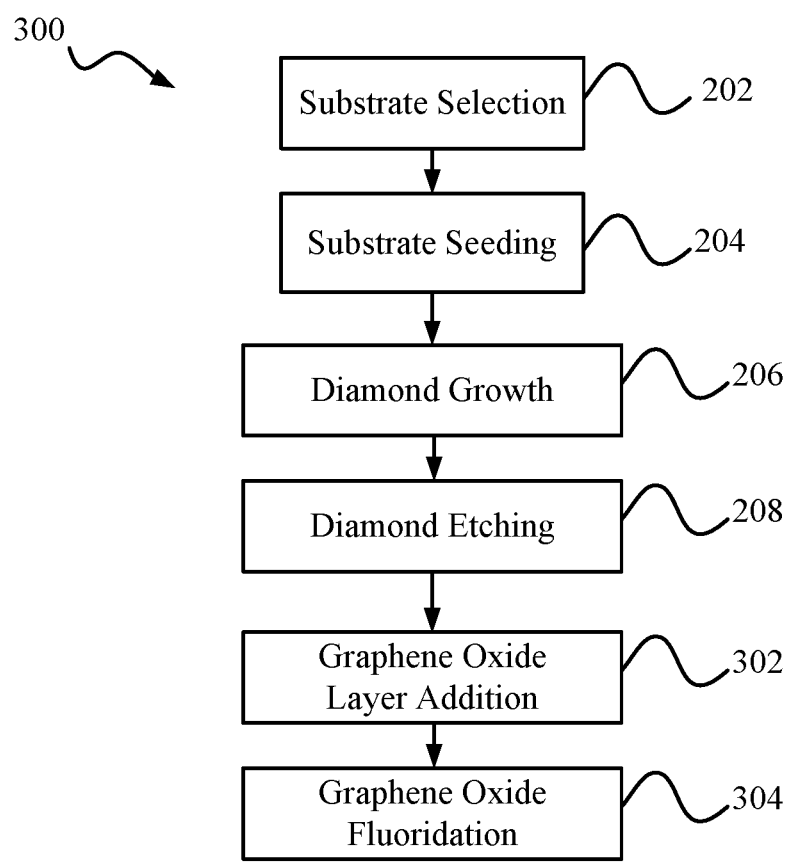
FIG. 3 is a block diagram of a second embodiment of a method for fabricating a protective diamond coating.

The following detailed description, which references to and incorporates the drawings, describes and illustrates one or more specific embodiments. These embodiments, offered not to limit but only to exemplify and teach, are show n and described in sufficient detail to enable those skilled in the art to practice what is claimed. Thus, for the sake of brevity, the description may omit certain information known to those of skill in the art.

Directed energy and electromagnetic weapons are an evolving threat to military vehicles and equipment. There is a desire for countermeasures to improve the ability to withstand attacks or exposure to directed energy and electromagnetic weapons. Protection is needed for opaque surfaces such as cowling material used to cover engines, electronics, personal, and other susceptible systems as well as materials that may be transmissive to visible frequencies (for example, windows and canopies) or frequencies that will be radiated or monitored (sensor windows or radome material). Specifically, advanced coating materials are required to both maximize transmissivity and preserve operational integrity under harsh conditions.

Diamond materials have properties that may provide advantages as a coating material. Diamond materials possess favorable material properties such as ultra-hardness/scratch-resistance, high thermal conductivity, hydrophobicity, chemical inertness, radiation hardness. The systems and methods disclosed herein provide a novel diamond based countermeasure coating system.

Providing targeted thickness of diamond can maximize the reflectance of specific wavelengths which may be used in directed energy weapon systems. For example, if 800 nanometers to 1 micrometer contained wavelengths are used for directed energy systems, it may be desired to provide protection from said directed energy systems. Using open-source software for the design, optimization, and synthesis of optical filters, i.e. Open Filters, it can be shown that a nanodiamond layer of 92 to 96 nanometers on a fused silica substrate provides at least 36% reflectance to energy in the 800 nanometers to 1 micrometer bandwidth. That is, 36 percent of the energy is reflected away from the protected substrate reducing the damage that may be caused by the directed energy. Additionally, the diamond layer has excellent thermal conductivity which spreads the thermal bloom from impacting energy providing additional protection to the underlying substrate.

FIG. 1 shows an exemplary diamond protective coaling structure 100 including a substrate 102, and a diamond layer 104. The substrate 102 may protected by the diamond layer 104. The diamond layer 104 may be 82 to 96 nanometers thick when the substrate 102 is fused silica. A beam from a directed energy system, illustrated as arrow 106, impacting on the diamond layer 104 may have approximately 36 percent of the power of the beam reflected, illustrated as arrows 108. In addition, the diamond layer 104 has excellent thermal conductivity, and a thermal bloom associated with the impact of the directed energy beam 106 may be spread out providing protection to the substrate 102 and protected matter 110, such as underlying systems or personal. Diamond layer 104 may by a variety of diamond materials, including, but not limited to, nanodiamond, single crystal diamond, and nanocrystalline diamond.

Substrate 104 may be, but is not limited to, a silicon window which may be used as a sensor window. Simulations with Open Filters shows that coating the silicon layer 102 with a diamond layer 104 of 180 to 192 nanometers of nanodiamond provides 28 percent reflectance to 800 nanometers to 1 micrometer. That is, 28% of the energy in the band is reflected away from the substrate 102 providing protection to the substrate 102 and protected matter 110.

FIG. 2 shows a first exemplary block diagram of an embodiment of a method 200 for fabricating a diamond protective coating structure, such as, but not limited to, diamond protective coating structure 100. Fabrication of such a structure 100 can be realized utilizing, for example, but not limited to, a combination of chemical vapor deposition (CVD), physical vapor deposition (PVD), and reactive ion etching systems, commonly utilized in the fabrication of thin film material structures.

Method 200 may include steps such as substrate selection 202, substrate seeding 204, diamond growth 206, and diamond etching 208. The substrate selection 202 step may include selecting a substrate such as, but not limited to, fused silica, silicon, and other materials. The substrate selected the substrate selection 202 step may be exposed to a standard acid cleaning mixture, for example 4:1 $H_2SO_4/H_2O_2$, $H_2O_2$, 5:1:1 $H_2O/H_2O_2/HCl$. In the substrate seeding 204 step, the substrate may be seeded with, for example, but not limited to, a nanoseed solution mixture. The substrate seeding 204 step may also include subjecting the substrate to an ultrasoniced in alcohol solution to promote nucleation and film agglomeration. The diamond growth 206 step may include exposing the seeded substrate of step 202 to plasma gas mixture, such as, but not limited to, a Methane, Argon, and Hydrogen plasma gas mixture in a chemical vapor deposition system. The result of the seeded substrate 206 step may be a thin nanocrystalline diamond film. In the case of growth of the diamond beyond the target thickness, in the diamond etching 208 step, etching, such as, but not limited to, reactive ion etching may produce, for example, bulk planarized uniform diamond films of the desired thickness. The diamond etching 208 may include Reactive Ion Etching (RIE) with $CHF_3$ and $CF_4$ at a ratio of 3:1.

The diamond growth 206 step may include, but is not limited to, using a Hot Filament Chemical Vapor Deposition (HFCVD) system and a Microwave Plasma Chemical Vapor Deposition (MWCVD) system. The diamond growth 206 may also include growing the diamond directly on a substrate, such as substrate 104. The diamond growth 206 step may also include growing the diamond on a sacrificial layer (not shown). The sacrificial layer may be then be etched away or removed and the diamond layer may be applied to the desired surface, for example protected matter 110.

FIG. 3 shows a second exemplary block diagram of an embodiment of a method 300 for fabricating a diamond protective coating structure. Method 200 may include steps such as substrate selection 202, substrate seeding 204, diamond growth 206, diamond etching 208, graphene oxide layer addition 302 step, and a graphene oxide fluoridation layer addition 304 step. In the graphene oxide layer addition 302 step a graphene oxide layer may be added by spin coating using a solution of graphene oxide in an aqueous solution. Alter applying the solution to the substrate, a spin coater may be used to provide uniform coverage. The substrate may be heated to 100 deg Celsius for about 1 minute to set the graphene oxide layer. The thickness of Graphene oxide layers may be increased by repeating the spin coating process followed by heating as mentioned above. In graphene oxide fluoridation layer addition 304 step the substrate may be subjected to a fluorine environment, for example, in a Plasma Enhanced Chemical Vapor Deposition (PBCVD) tool resulting in a layer of fluorinated graphene oxide layer that may be less than 100 nanometers thick.

The systems and methods described herein may incorporate systems and methods previously disclosed and described in U.S. Patent Publication No. 2013/0026492, by Adam Khan, published on Jan. 31, 2013; U.S. Pat. No. 8,354,290, issued to Anirudha Sumant, et al, on Jan. 15, 2013; U.S. Pat. No. 8,933,462, issued to Adam Khan on Jan. 13, 2015; U.S. Patent Publication No. 2015/0206749, by Adam Khan, published on Jul. 23, 2015; U.S. Patent Publication No. 2015/0295134, by Adam Khan, et al, published on Oct. 15, 2015, and U.S. Patent Publication No. 2019/0064404, by Ernest Schirmann, et al, published on Feb. 28, 2019, ail of which are fully incorporated herein by reference.

This document sets forth justification and a preferred embodiment of fabrication, however, the performance characteristics and materials characteristics described in this application are not necessarily performance bounds or limitations of the invention. They merely demonstrate some aspects of the invention that have presently been tested. The various aspects of the invention described in this section will not necessarily all be part of every embodiment of the invention. This disclosure provides several preferred embodiments of fabrication, however, the performance characteristics and materials characteristics described in this application are not necessarily performance bounds or limitations of the invention. These disclosures merely demonstrate some aspects of the invention that have presently been tested.

The word "exemplary" is used herein to mean "serving as an example, instance, or illustration." Any embodiment or variant described herein as "exemplary" is not necessarily to be construed as preferred or advantageous over other embodiments or variants. All of the embodiments and variants described in this description are exemplary embodiments and variants provided to enable persons skilled in the art to make and use the invention, and not necessarily to limit the scope of legal protection a Horded the appended claims.

The above description of the disclosed embodiments is provided to enable any person skilled in the art to make or use that which is defined by the appended claims. The following claims are not intended to be limited to the disclosed embodiments. Other embodiments and modifications will readily occur to those of ordinary skill in the art in view of these teachings. Therefore, the following claims are intended to cover all such embodiments and modifications when viewed in conjunction with the above specification and accompanying drawings.

We claim:

1. A method of fabricating a diamond protective coating structure comprising:
   cleaning and seeding a substrate;
   depositing a crystalline diamond layer on the substrate;
   etching the substrate; and
   attaching the substrate to protected matter,
   wherein the crystalline diamond layer reduces the impact of at least 28 percent of electromagnetic energy in a beam having a bandwidth of 800 nanometer to 1 micrometer.

2. The method of claim 1, wherein the crystalline diamond layer has a thickness from 92 to 96 nanometers, and the crystalline diamond layer reduces the impact of at least 36 percent of the electromagnetic energy in the beam.

3. The method of claim 1, wherein the substrate is fused silica and the crystalline diamond layer thickness is between 82 and 96 nanometers.

4. The method of claim 1, wherein the substrate is silicon and the crystalline diamond layer thickness is between 180 and 192 nanometers.

5. The method of claim 1, wherein the crystalline diamond layer is one of a group comprising single crystal diamond, polycrystalline diamond, and nanocrystalline diamond.

6. The method of claim 1, wherein depositing a crystalline diamond layer includes hot filament chemical vapor deposition.

7. The method of claim 1, wherein depositing a crystalline diamond layer includes microwave plasma chemical vapor deposition.

8. The method of claim 1, further including adding a fluoridated oxide layer on the crystalline diamond layer.

* * * * *